(12) United States Patent
Krojer

(10) Patent No.: US 11,804,505 B2
(45) Date of Patent: Oct. 31, 2023

(54) CMOS WAVEFRONT SENSORS

(71) Applicant: Matthias Krojer, Ilmenau (DE)

(72) Inventor: Matthias Krojer, Ilmenau (DE)

(73) Assignee: X-FAB SEMICONDUCTOR FOUNDRIES GMBH, Erfurt (DE)

(*) Notice: Subject to any disclaimer, the term of this patent is extended or adjusted under 35 U.S.C. 154(b) by 0 days.

(21) Appl. No.: 17/006,116

(22) Filed: Aug. 28, 2020

(65) Prior Publication Data

US 2021/0066376 A1  Mar. 4, 2021

(30) Foreign Application Priority Data

Aug. 28, 2019 (GB) .................................. 1912344

(51) Int. Cl.
*H01L 27/146* (2006.01)

(52) U.S. Cl.
CPC .... *H01L 27/14627* (2013.01); *H01L 27/1462* (2013.01); *H01L 27/14685* (2013.01); *H01L 27/14643* (2013.01)

(58) Field of Classification Search
CPC .......... H01L 27/14627; H01L 27/1462; H01L 27/14685; H01L 27/14643; H01L 27/1446; H01L 31/02327; G01J 1/4257; G01J 9/00
See application file for complete search history.

(56) References Cited

U.S. PATENT DOCUMENTS

| | | | | |
|---|---|---|---|---|
| 6,130,419 A | * | 10/2000 | Neal | G02B 5/1876 |
| | | | | 250/201.9 |
| 7,196,388 B2 | * | 3/2007 | Wu | H01L 27/14685 |
| | | | | 257/431 |
| 2007/0146531 A1 | * | 6/2007 | Toshikiyo | G02B 27/4205 |
| | | | | 348/340 |
| 2008/0011937 A1 | * | 1/2008 | Toshikiyo | H01L 27/14625 |
| | | | | 250/208.1 |
| 2009/0152453 A1 | * | 6/2009 | Li | G02B 26/06 |
| | | | | 250/235 |
| 2018/0358483 A1 | * | 12/2018 | Kautzsch | H01L 27/14629 |
| 2019/0098187 A1 | * | 3/2019 | Wang | G02B 3/0056 |

FOREIGN PATENT DOCUMENTS

GB  2564246  9/2019

OTHER PUBLICATIONS

GB, Combined Search and Examination Report; Great Britain Patent Application Serial No. GB1912344.7, 6 pages (dated Dec. 10, 2019).

* cited by examiner

*Primary Examiner* — Jonathan Han
(74) *Attorney, Agent, or Firm* — Thompson Hine LLP

(57) ABSTRACT

A Complementary Metal Oxide Semiconductor (CMOS) wavefront sensor including a sensor element having an array of photodiodes and a passivation layer covering the sensor element. The sensor further includes a binary lens formed in the passivation layer and arranged to focus incident light onto the sensor element.

10 Claims, 8 Drawing Sheets

CMOS WAVEFRONT SENSORS

This Application claims priority to United Kingdom Patent Application No. 1912344.7 filed on Aug. 28, 2019 and entitled CMOS WAVEFRONT SENSORS, the entire contents of which are hereby incorporated by reference.

TECHNICAL FIELD

The present invention relates to wavefront sensors and in particular CMOS wavefront sensors.

BACKGROUND

Wavefront sensors may be used for the inspection of optical devices, in terrestrial telescopes for waveform correction, in medical optics to measure the curvature of the eye, and also for laser beam characterization and alignment, for example.

A wavefront sensor can consist of several angle sensors and allows a user to analyze the shape of an incident light beam's wavefront. Typical wavefront sensors achieve this by dividing the beam into an array of discrete intensity points using a microlens array. These sensors are called Shack-Hartmann Sensors (SHS). In an SHS, the incoming wavefront is divided by a microlens array and the discrete intensity points are focused on a detector (such as a CCD pixel chip). That is, each microlens focuses the light to a spot on the detector.

For an individual microlens (or "lenslet"), the spot position will only be directly behind the lens if the incident wavefront is plane and parallel to the microlens. A distorted wavefront will cause a spot to be deviated in X and Y so that every spot lies away from the optical axis Z by an angle 0, as shown in FIG. 1.

A planar wavefront incident on the Shack-Hartmann Sensor's microlens array and imaged on the CCD sensor will display a regularly spaced grid of spots, as shown in FIG. 2a. An aberrated or distorted wavefront, on the other hand, will cause individual spots to be displaced from the optical axis of each microlens, as shown in FIG. 2b. This displacement can be used to calculate the shape of the wavefront that was incident on the microlens array. If the displacement is large, then the beam may be absorbed by a neighboring pixel (crosstalk).

SUMMARY

Aspects of the present invention provide Complementary Metal Oxide Semiconductor (CMOS) wavefront sensors and methods of forming such sensors as set out in the accompanying claims. In one embodiment, the invention is a Complementary Metal Oxide Semiconductor (CMOS) wavefront sensor including a sensor element having an array of photodiodes and a passivation layer covering the sensor element. The sensor further includes a binary lens formed in the passivation layer and arranged to focus incident light onto the sensor element.

Certain embodiments of the invention will now be described, by way of example only, with reference to the accompanying drawings.

DETAILED DESCRIPTION

Figure 1:
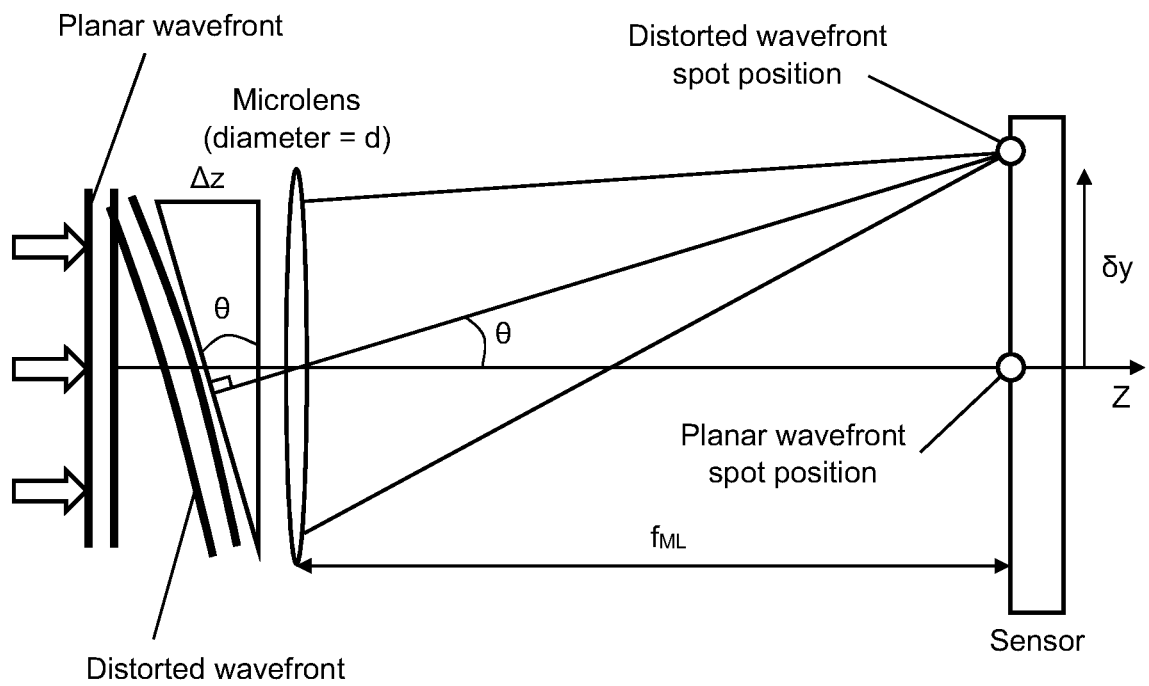
FIG. 1 shows a schematic diagram of a wavefront interacting with a lens.
Figure 2A:
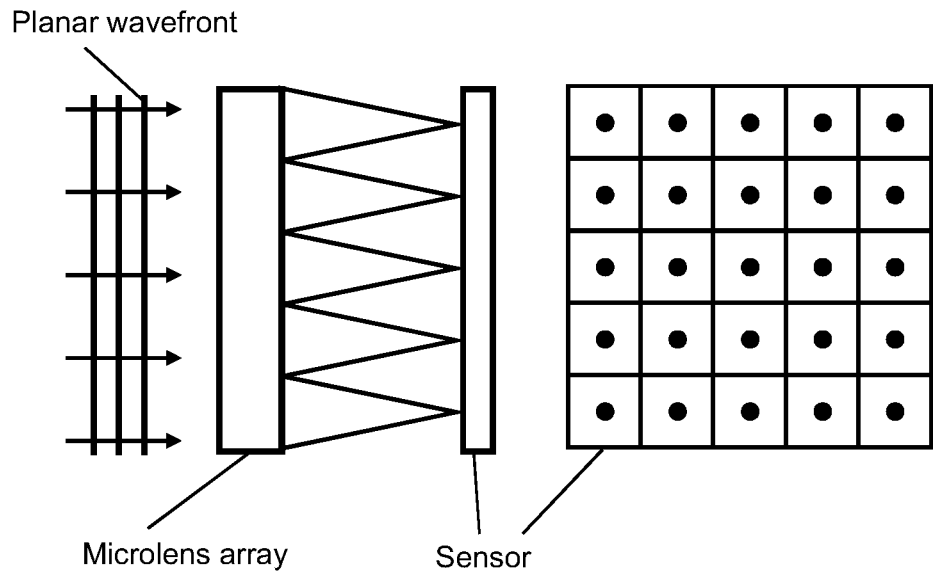
FIG. 2a shows a schematic diagram of a wavefront sensor detecting an incident plane wave.
Figure 2B:
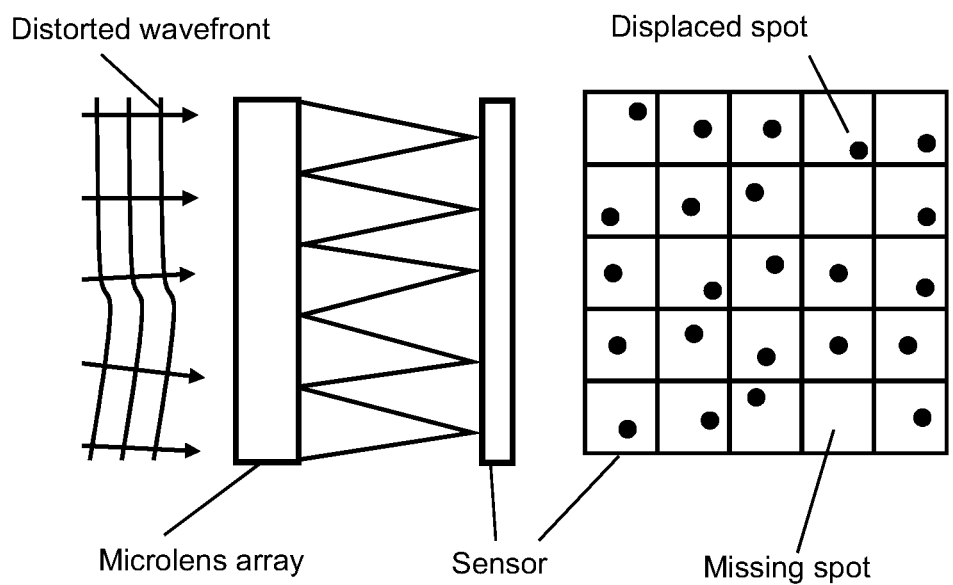
FIG. 2b shows a schematic diagram of the same wavefront sensor detecting an incident distorted wave.

Embodiments described herein provide a CMOS wavefront sensor having a binary lens in the passivation layer (typically a nitride layer). The sensor comprises at least one sensor element having an array of photodiodes, which detect incident light focused by the binary lens. The light intensity on each photodiode depends on the incident angle of the light beam. For example, a light beam at normal incidence is focused by the lens towards the center of the sensor element, and photodiodes closer to the edge will receive a lower intensity. For light incident at an angle, the binary lens can focus the beam to a spot on an off-center photodiode. The intensity profile over the array of photodiodes can be recorded and used to determine the angle of incidence of light onto the array (i.e. onto that sensor element).

The binary lens comprises a pattern formed from two materials, where one material may be air, such that the lens has areas of alternating refractive index. The pattern can comprise alternating peaks and troughs formed in a layer of the CMOS wavefront sensor. The troughs can then be filled with a material having a different refractive index to that of the layer with the peaks. The binary lens may comprise annular rings etched into the passivation layer using photolithography. Alternatively, the binary lens may comprise annular squares with rounded corners. A Fresnel zone plate design may, for example, be used to design the binary lens. The pattern of the binary lens may cover the whole sensor element or a portion of the sensor element.

The binary lens can be designed to work at any target range of wavelengths, and is not limited to operating in any particular wavelength spectrum. The embodiments are flexible for different ranges of the ultraviolet, visible and near infrared spectra. The following formula can be used to design a lens structure that is optimized for a particular wavelength (λ) of light:

$$r_n = \sqrt{n\lambda f + \frac{n^2\lambda^2}{4}}, \qquad (1)$$

where $r_n$ is the radius of the $n^{th}$ ring/edge (n=1, 2, 3, . . . ) of the binary structure of the lens, λ is the (target) wavelength, and f is the focal length.

The depth of the etched troughs of the binary structure is given by:

$$\Delta h = \frac{\lambda}{2 \cdot \Delta n_{refractive}}, \quad (2)$$

where $\Delta n_{refractive}$ is the difference in refractive index between the lens material and the material above it, e.g. $\Delta n_{refractive} = n_{lens\ material} - n_{air}$.

The distance between the array of photodiodes and the binary lens may be in the range of 1 μm to 15 μm. This relatively short offset between the lens and the photodiodes can reduce crosstalk (i.e. a beam absorbed by a neighboring pixel), as the absolute displacement of the focused light spot from the center is less for a given angle of incidence. This distance, between the lens and the photodiodes, can be controlled by the number and thickness of layers in the backend stack of the CMOS device. The passivation layer is a part of the backend stack, and for clarity the backend stack can be defined herein as the stack of layers formed in the back-end-of-line (BEOL) process on top of the silicon substrate. For example, the metallization layers (also known as metal layers) and inter-layer vias are formed in the BEOL process and are part of the backend stack. The BEOL process is performed after the front-end-of-line (FEOL) process, in which the CMOS devices (e.g. transistors, resistors and photodiodes) are built in the silicon. In general, the backend stack can comprise a plurality of metal layers and dielectric layers, on top of which the passivation layer is deposited.

The focal length of the binary lens can be relatively small, to focus incident light on the pn junction of the photodiodes of the sensor element. The binary lens may therefore have a focal length substantially equal to the optical distance between the lens and the pn junction. The optical distance between the lens and the pn junction depends on the geometric distance between the microlens array and the photodiodes (e.g. 1 μm to 15 μm) plus the geometric distance from the silicon surface to the pn junction (typically 2 μm to 3 μm). To get the focal length, the optical distance is calculated by multiplying the corresponding refractive index with the geometric distance (i.e. optical distance=geometric distance though material times the refractive index of that material). The refractive index of silicon oxide is approximately 1.5 and the refractive index of silicon is approximately 3.4. Hence, the optical distance between the binary lens and the pn junction of a photodiode may be in the range of (1 μm*1.5+2 μm*3.4) 8 μm to (15 μm*1.5+3 μm*3.4) 33 μm. Accordingly, the focal length of the binary lens may be in range of 8 μm to 33 μm. This is smaller than the focal length of microlenses in known SHS sensors, where the microlens array is made separately from the photosensitive elements.

The array of photodiodes may comprise 2×2 photodiodes. Surprisingly, the use of only four photodiodes in the sensor element can be used to accurately determine the angle of incidence. However, larger arrays of photodiodes may provide greater precision, and the sensor element may include any one of 3×3 photodiodes, 4×4 photodiodes, and 5×5 photodiodes, for example. Although a larger number of photodiodes may be used in the sensor element, this can decrease the resolution of the determined wavefront and lead to spatial aliasing. Each sensor element may cover an area in the range of 400 μm² (i.e. 20 μm×20 μm) to 2,500 μm² (i.e. 50 μm×50 μm), depending on the number of photodiodes in that sensor element.

In general, the CMOS wavefront sensor may comprise an array of sensor elements and respective binary lenses. A greater number of sensor elements allows the wavefront to be determined over a larger area. For example, a wavefront sensor for laser beam characterization can have an array of sensor elements sufficiently large to cover the full beam width of the laser beam. The density of sensor elements determines the resolution of the wavefront. For wavefronts having a high spatial frequency, a greater density of sensor elements may be required and a smaller array of photodiodes (e.g. 2×2 or 3×3 photodiodes) in each sensor element may be appropriate Described herein are also embodiments of a method of forming Complementary Metal Oxide Semiconductor (CMOS) wavefront sensors. The method comprises forming a sensor element comprising an array of photodiodes, depositing the passivation layer covering said sensor element, and then forming in said passivation layer a binary lens arranged to focus incident light onto said sensor element.

The photodiodes can be formed in a silicon substrate, for example using the CMOS "DIFF" mask to pattern and dope the silicon substrate. To form the binary lens, the passivation layer can be patterned and etched using photolithography. The etch can be performed using, for example, plasma etching or wet etching. The method requires only CMOS process steps, which enables the wavefront sensor to be formed on a single chip without requiring other manufacturing technologies.

A plurality of sensor elements can be formed on the same substrate to make a wavefront sensor having a larger area. In such cases, the passivation layer is etched to form a plurality of binary lenses, one for each sensor element.

Figure 3A:
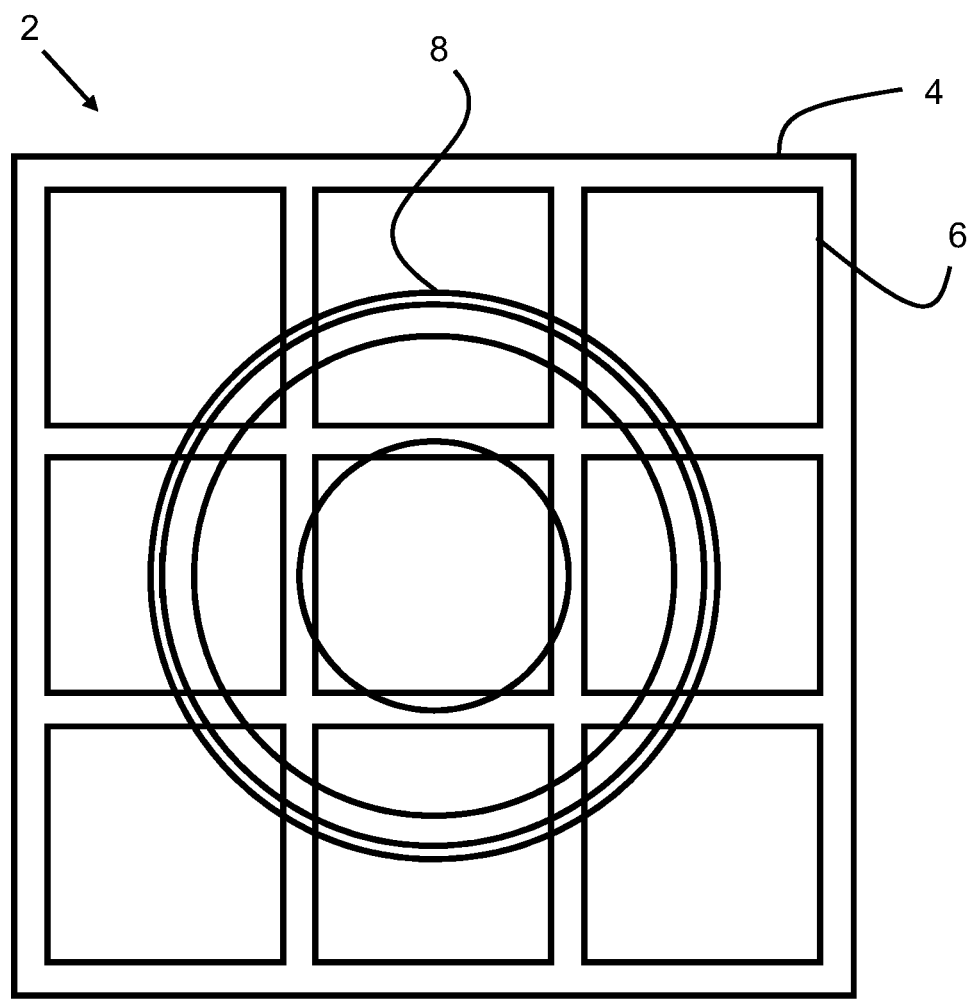
FIG. 3a shows a schematic diagram of a top view of a CMOS wavefront sensor according to an embodiment having a circular binary lens.

FIG. 3a shows a schematic top view of a CMOS wavefront sensor 2 according to an embodiment. The sensor 2 comprises a sensor element 4 having an array of 3×3 photodiodes 6 (also referred to as "pixels"). The sensor 2 also comprises a binary lens 8, which overlaps the sensor element 4. The binary lens 8 is arranged to focus light onto the sensor element 4. The binary lens 8 comprises a plurality of concentric circles etched into the passivation layer. For light at normal incidence to the sensor 2, the lens 8 focusses the light onto the central photodiode 6 in the middle of the sensor element 4. For light incident at an angle, the lens 8 focusses the light onto one of the off-center photodiodes (depending on the specific beam angle).

Figure 3B:
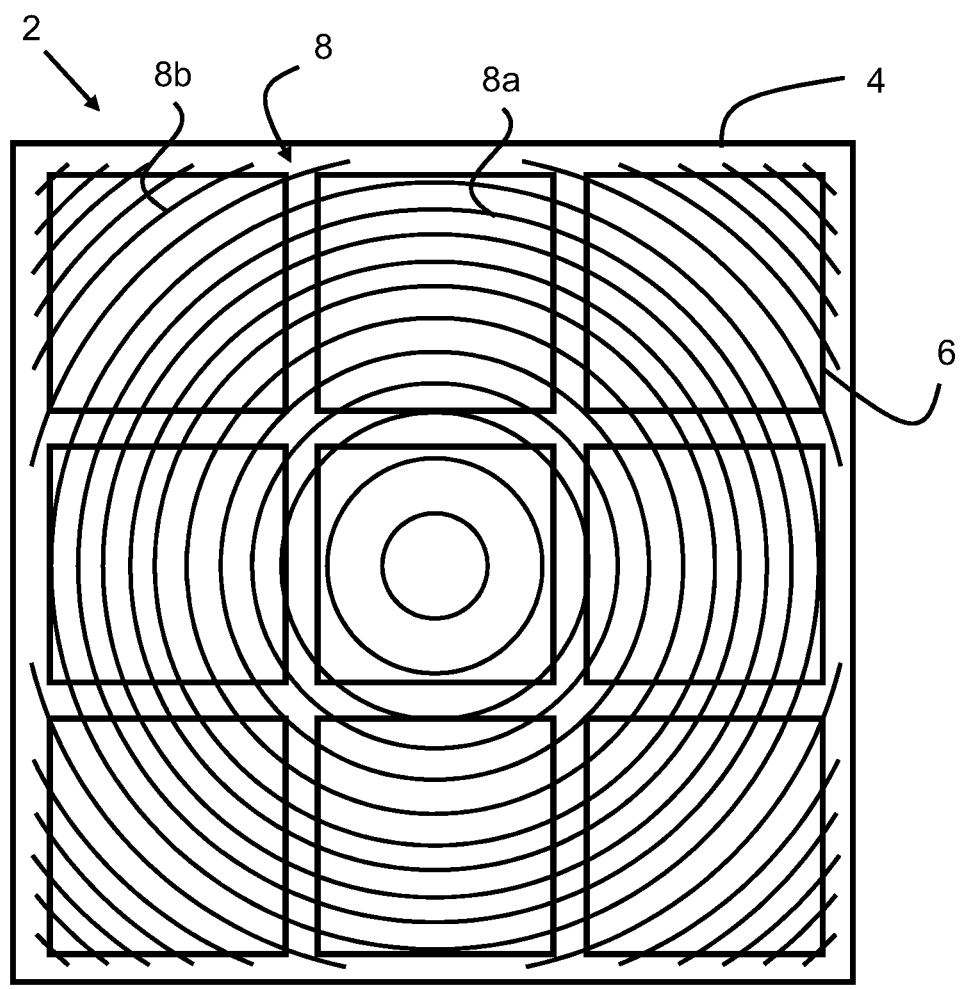
FIG. 3b shows a schematic diagram of a top view of a CMOS wavefront sensor according to an embodiment having a different circular binary lens.

FIG. 3b shows a similar CMOS wavefront sensor 2, having an array of sensor elements 4 (one shown) with nine photodiodes 6. To aid understanding, similar features in different figures have been given the same reference numerals and the reference numerals are not intended to be limiting. The sensor 2 comprises a binary lens 8 comprising a lens pattern with circular rings 8a at the center of the sensor element 4 and ring segments 8b (circular arcs) towards the edges/corners of the sensor element 4. The binary lens 8, with ring segments 8b, can have the advantage of covering substantially the whole sensor element 4.

Figure 4:
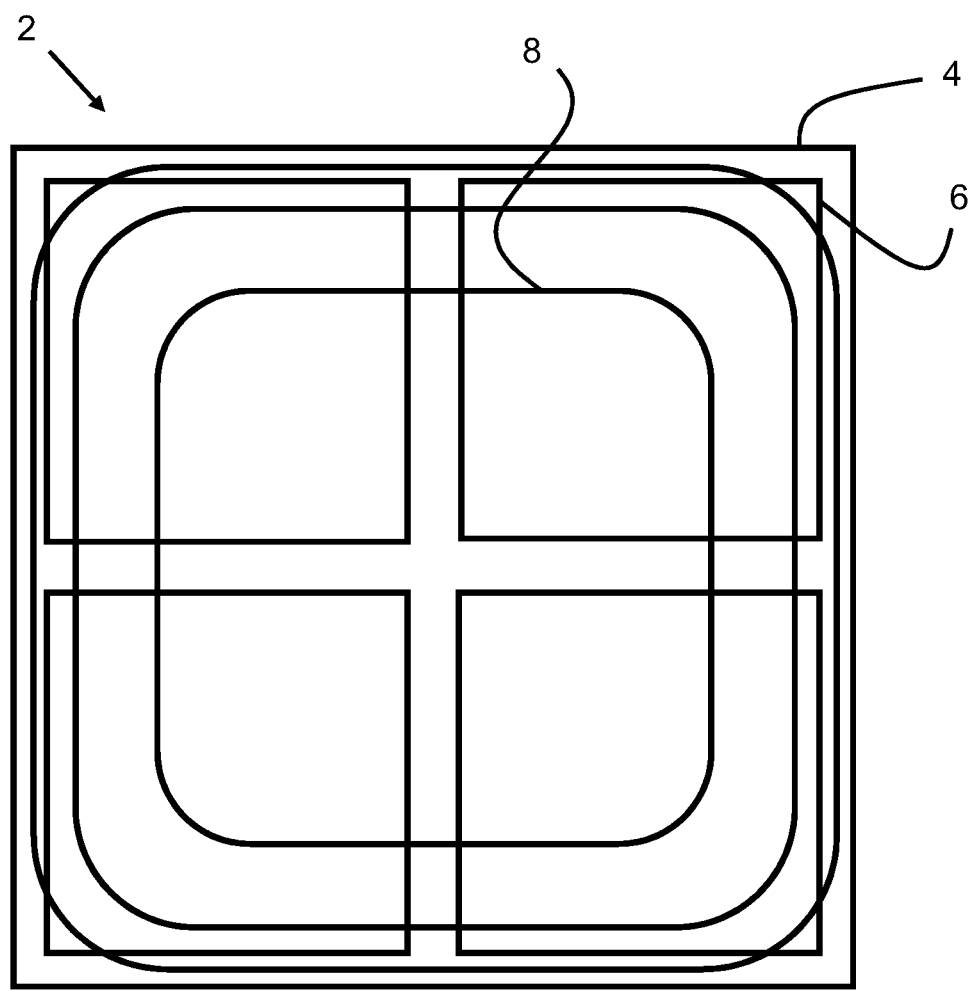
FIG. 4 shows a schematic diagram of a top view of a CMOS wavefront sensor according to another embodiment having a binary lens formed from concentric squares.

FIG. 4 shows a schematic top view of a CMOS wavefront sensor 2 according to another embodiment. The sensor 2 comprises a sensor element 4 having an array of 2×2 photodiodes 6. The sensor 2 comprises a binary lens 8 arranged to focus incident light onto the sensor element 4. The binary lens 8 comprises a plurality of concentric squares with rounded corners etched into the passivation layer. This type of lens can be particularly advantageous for directing light incident around the edge of the sensor element 4 onto the sensor element 4.

Figure 5:
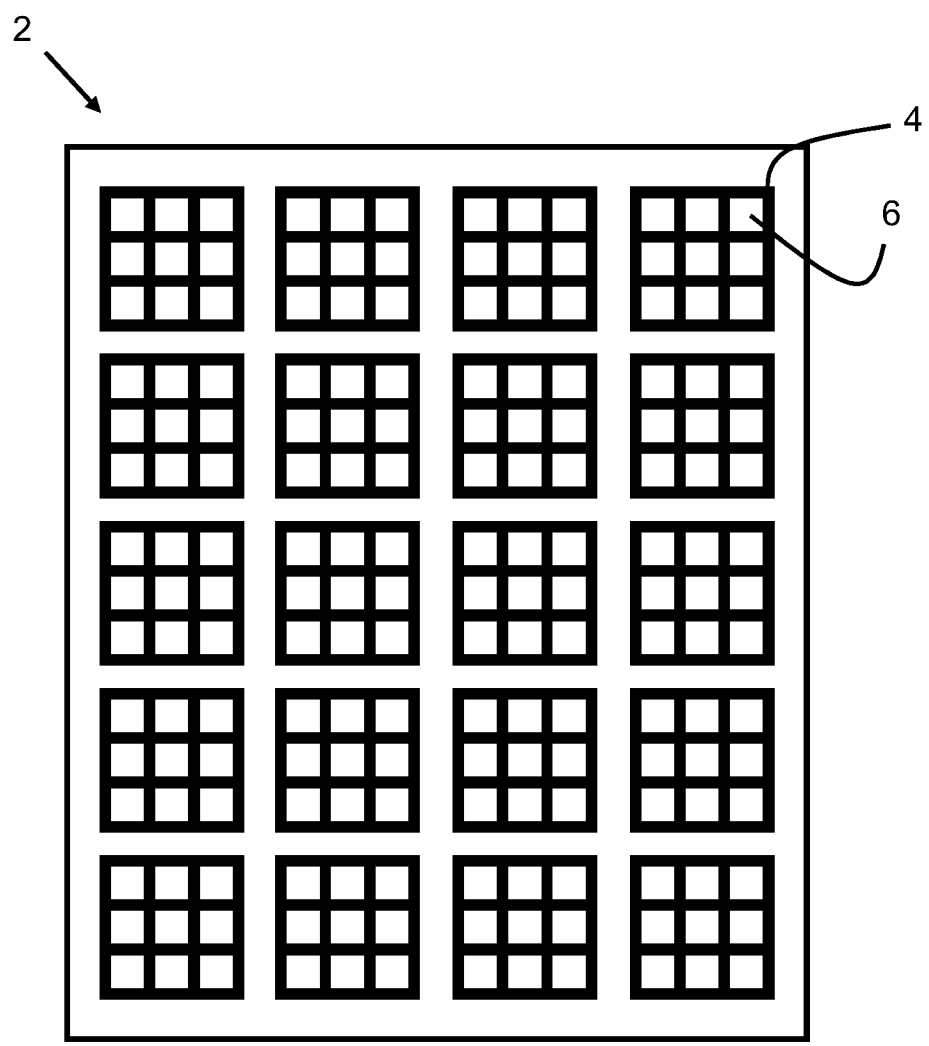
FIG. 5 shows a schematic diagram of a top view of a CMOS wavefront sensor according to another embodiment having an array of sensor elements.

FIG. 5 shows a schematic top view of a CMOS wavefront sensor 2 according to an embodiment. The sensor comprises a plurality of sensor elements 4. Each sensor element 4 comprises an array of photodiodes 6. For each sensor element 4, the sensor 2 comprises a binary lens (not shown) for directing light into the sensor element 4.

Figure 6:
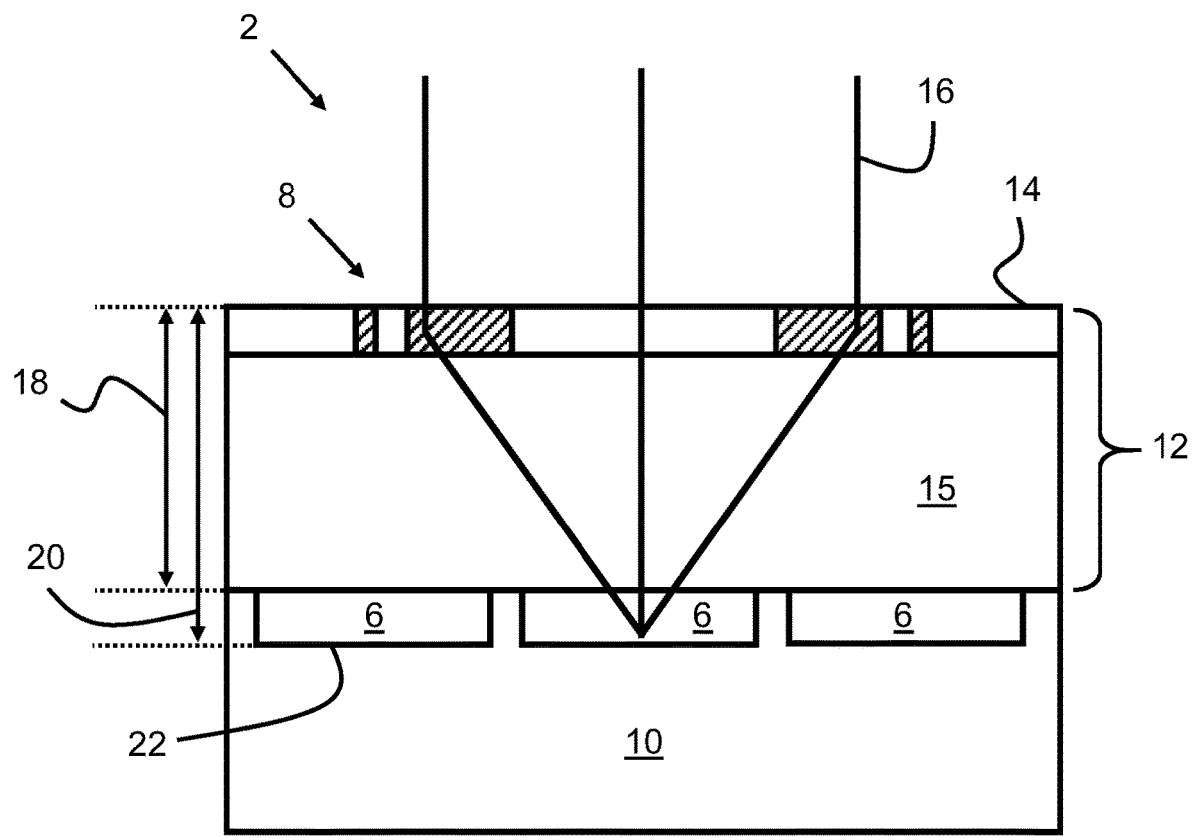
FIG. 6 shows a schematic diagram of a cross-section of a CMOS wavefront sensor according to an embodiment.

FIG. 6 shows a schematic diagram of a cross-section of a CMOS wavefront sensor 2 according to an embodiment. The sensor 2 comprises an array of photodiodes 6 (three shown) in a silicon substrate 10. On the silicon substrate 10 is a CMOS backend stack 12 comprising a nitride passivation layer 14. The passivation layer 14 has a binary lens 8 formed in it. The backend stack 12 comprises further layers 15 being metal layers and dielectric layers (typically oxide). A beam of light 16 is incident upon the sensor 2 at a normal angle and is focused by the lens 8 into the central photodiode 6. Since the binary lens 8 is directly integrated in the passivation layer 14 of the CMOS sensor 2, the distance 18 between the binary lens 8 and the photodiodes 6 is relatively small compared to that of known wavefront sensors. For example, the distance 18 from the top of the binary lens 8 to the photodiodes 6 in the silicon substrate 10 can be in the range of 1 µm to 15 µm. Having a smaller distance 18 between the lens 8 and the photosensitive elements (i.e. the photodiodes 6) can be advantageous for reducing crosstalk, as a larger angle of incidence can be accommodated. The focal length of the binary lens 8 is substantially equal to the optical distance 20 between the lens 8 and the pn junctions 22 of the photodiodes 6, in order to focus the light onto the pn junction of a photodiode 6 and thereby enable the angle of incidence of the beam 16 to be determined. The pn junction may have a depth of about 2 µm to 3 µm, and the optical distance 20 between the lens 8 and the pn junction 22 may be in the range of 8 µm to 33 µm.

Figure 7:
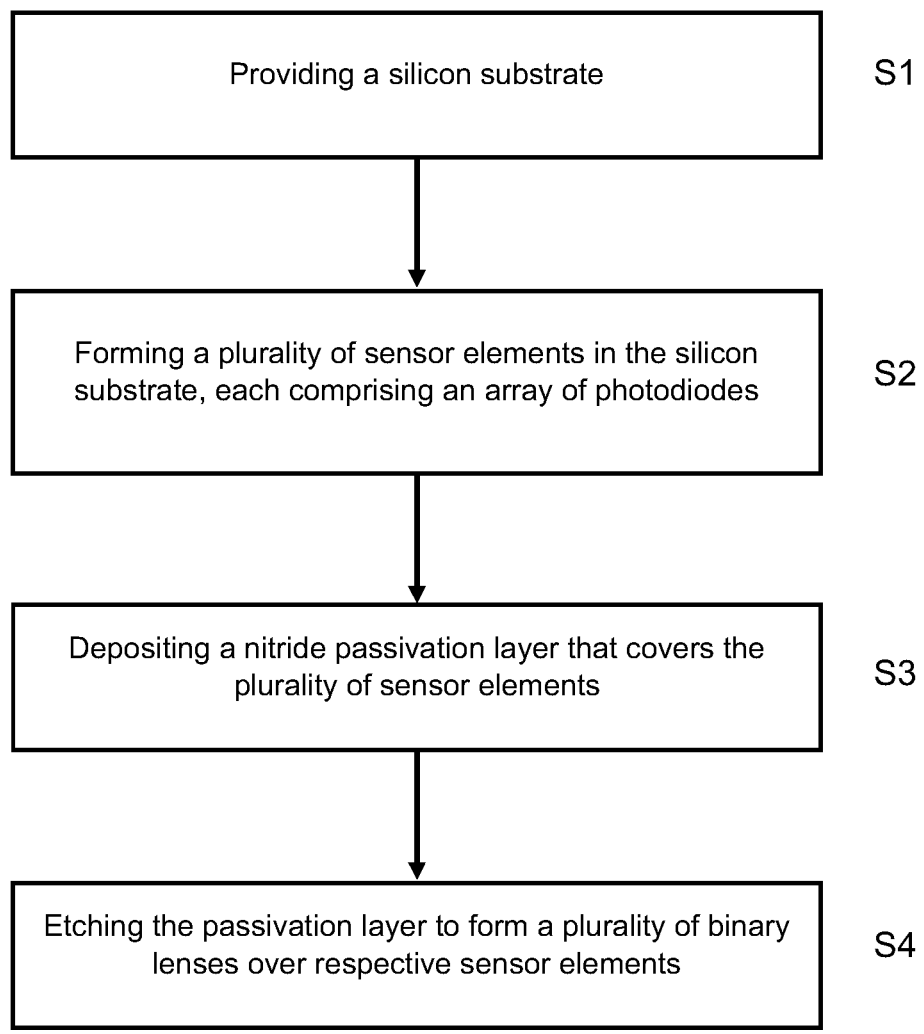
FIG. 7 shows a flow diagram of a method of forming a CMOS wavefront sensor according to an embodiment.

FIG. 7 is a flow diagram of a method of forming a CMOS wavefront sensor according to an embodiment. The method comprises providing a silicon substrate (step S1), and forming a plurality of sensor elements in the silicon substrate, each comprising an array of photodiodes (step S2). The method further comprises depositing a nitride passivation layer that covers the plurality of sensor elements (step S3) and etching the passivation layer to form a plurality of binary lenses over respective sensor elements (step S4). All of the steps are performed in a CMOS chip manufacturing process, without requiring other manufacturing technologies. Hence, the embodiment provides a one chip solution to making wavefront sensors.

While specific embodiments of the invention have been described above, it will be appreciated that the invention may be practiced otherwise than as described in the specific embodiments. The descriptions above are intended to be illustrative, not limiting. It will be apparent to one skilled in the art that modifications may be made to the embodiments as described without departing from the scope of the claims set out below.

Each feature disclosed or illustrated in the present specification may be incorporated in the invention, whether alone or in any appropriate combination with any other feature disclosed or illustrated herein.

What is claimed is:

1. A Complementary Metal Oxide Semiconductor (CMOS) device comprising:
   a wavefront sensor configured to determine a shape of a wavefront and having: a plurality of sensor elements, wherein each sensor element comprises an array of photodiodes; a passivation layer covering said plurality of sensor elements; and a corresponding plurality of binary lenses formed in said passivation layer, wherein each binary lens of said corresponding plurality of binary lenses is arranged to focus incident light onto a respective sensor element of said plurality of sensor elements, wherein said wavefront sensor is configured to determine an intensity profile of said focused incident light over said array of photodiodes of each sensor element of said plurality of sensor elements and to use said intensity profile to determine an angle of incidence of light onto said sensor element.

2. A CMOS device according to claim 1, wherein a distance between a binary lens of said plurality of binary lenses and said array of photodiodes of said respective sensor element is in the range of 1 µm to 15 µm.

3. A CMOS device according to claim 1, wherein each binary lens of said plurality of binary lenses has a focal length in the range 8 µm to 33 µm (optical distance).

4. A CMOS device according to claim 1, wherein said array of photodiodes includes 2×2 photodiodes.

5. A CMOS wavefront sensor device according to claim 1, wherein said array of photodiodes includes one of 3×3 photodiodes, 4×4 photodiodes, and 5×5 photodiodes.

6. A CMOS device according to claim 1, wherein said passivation layer is a nitride layer in a CMOS backend stack of said CMOS device.

7. A method of forming a Complementary Metal Oxide Semiconductor (CMOS) device, the method comprising:
   providing a wavefront sensor configured to determine a shape of a wavefront, wherein said step of providing includes:
      forming a plurality of sensor elements, wherein each sensor element comprises an array of photodiodes;
      depositing a passivation layer covering said plurality of sensor elements; and
      forming in said passivation layer a corresponding plurality of binary lenses, wherein each binary lens of said corresponding plurality of binary lenses is arranged to focus incident light onto a respective sensor element of said plurality of sensor elements, wherein said wavefront sensor is configured to determine an intensity profile of said focused incident light over said array of photodiodes of each sensor element of said plurality of sensor elements and to use said intensity profile to determine an angle of incidence of light onto said sensor element.

8. A method according to claim 7, wherein said step of providing a wavefront sensor further comprises providing a silicon substrate, wherein said step of forming a plurality of sensor elements comprises doping said silicon substrate.

9. A method according to claim 8, wherein said step of forming said corresponding plurality of binary lenses comprises etching said passivation layer.

10. A method as claimed in claim 7, wherein said CMOS device is a CMOS device as claimed in claim 1.

* * * * *